(12) United States Patent
Iwata

(10) Patent No.: US 6,750,593 B2
(45) Date of Patent: Jun. 15, 2004

(54) HIGH FREQUENCY PIEZOELECTRIC RESONATOR HAVING REDUCED SPURIOUS MODES

(75) Inventor: Hirokazu Iwata, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 0 days.

(21) Appl. No.: 09/746,600

(22) Filed: Dec. 21, 2000

(65) Prior Publication Data
US 2002/0030424 A1 Mar. 14, 2002

(30) Foreign Application Priority Data
Dec. 22, 1999 (JP) .......................... 11-363659
May 16, 2000 (JP) ........................ 2000-144048

(51) Int. Cl.[7] .................. H01L 41/04; H01L 41/08; H01L 41/18; H02N 2/00
(52) U.S. Cl. .................. 310/321; 310/366; 310/365; 310/367; 310/363
(58) Field of Search ................ 310/363, 321, 310/289, 366, 365, 367, 320, 368, 324

(56) References Cited

U.S. PATENT DOCUMENTS

| | | | | |
|---|---|---|---|---|
| 3,764,848 A | * | 10/1973 | Berlincourt | 310/358 |
| 4,184,095 A | * | 1/1980 | Stacchiotti et al. | 310/361 |
| 5,085,760 A | * | 2/1992 | Razaq et al. | 204/431 |
| 5,148,076 A | * | 9/1992 | Albers et al. | 310/323 |
| 5,235,240 A | * | 8/1993 | Morita et al. | 310/365 |
| 5,596,239 A | * | 1/1997 | Dydyk | 310/311 |
| 5,644,274 A | * | 7/1997 | Kaida | 310/320 |
| 5,747,857 A | * | 5/1998 | Eda et al. | 257/416 |
| 5,933,061 A | * | 8/1999 | Takamoro et al. | 333/189 |
| 5,969,463 A | * | 10/1999 | Tomita et al. | 310/312 |
| 6,016,025 A | * | 1/2000 | Wold et al. | 310/369 |
| 6,046,530 A | * | 4/2000 | Funaki | 310/354 |
| 6,064,282 A | * | 5/2000 | Futakuchi et al. | 333/192 |
| 6,138,510 A | * | 10/2000 | Yoshida et al. | 73/504.02 |
| 6,188,163 B1 | * | 2/2001 | Danov | 310/316.01 |
| 6,215,375 B1 | * | 4/2001 | Larson, III et al. | 333/187 |
| 6,232,699 B1 | * | 5/2001 | Wajima | 310/320 |
| 6,314,638 B1 | * | 11/2001 | Kaido et al. | 118/410 |
| 2002/0014808 A1 | * | 2/2002 | Misu et al. | 310/312 |

FOREIGN PATENT DOCUMENTS

| | | | |
|---|---|---|---|
| DE | 1476332 A | * | 4/1989 |
| DE | 1476332 A | * | 4/1998 |

\* cited by examiner

Primary Examiner—Thomas M. Dougherty
Assistant Examiner—Julio Gonzalez R.
(74) Attorney, Agent, or Firm—Koda & Androlia (57) ABSTRACT

Disclosed is a piezoelectric resonator that has a piezoelectric plate that has formed thereon a pair of main electrodes and has formed thereon a second electrode surrounding the peripheral edge of the main electrode with a gap being provided between the second electrode and a peripheral edge of the main electrode. The material of the main electrode and the material of the second electrode are differentiated from each other. As the material of the second electrode there is used a material the density of that is lower than the material of the main electrode. With this construction, there is obtained means for suppressing the occurrence of spurious due to an inharmonic mode generating in the high frequency piezoelectric resonator.

11 Claims, 9 Drawing Sheets

HIGH FREQUENCY PIEZOELECTRIC RESONATOR HAVING REDUCED SPURIOUS MODES

BACKGROUND OF THE INVENTION

1. Field of the Invention

The present invention relates to a high frequency piezoelectric resonator and, more particularly, to a high frequency piezoelectric resonator that is adapted to suppress the occurrence of spurious.

2. Description of the Related Art

Following making higher the frequency, making higher the speed of data processing, and making larger the capacity, of communication apparatus, there has in recent years been a strong demand for making higher the frequency of a piezoelectric device that is used in each of these apparatus.

Development as to the increase in frequency of an AT cut crystal resonator has been being performed and, during this period of time, the frequency intended to be used therein has hitherto reached several hundreds of MHz. As well known, the waves in the vibration mode of the AT cut crystal resonator are in the thickness shear mode. Therefore, the frequency thereof is in inverse proportion to the thickness of the crystal plate. So, it is necessary to make thin the thickness of the crystal plate in order to make the frequency higher.

Figure 7A:
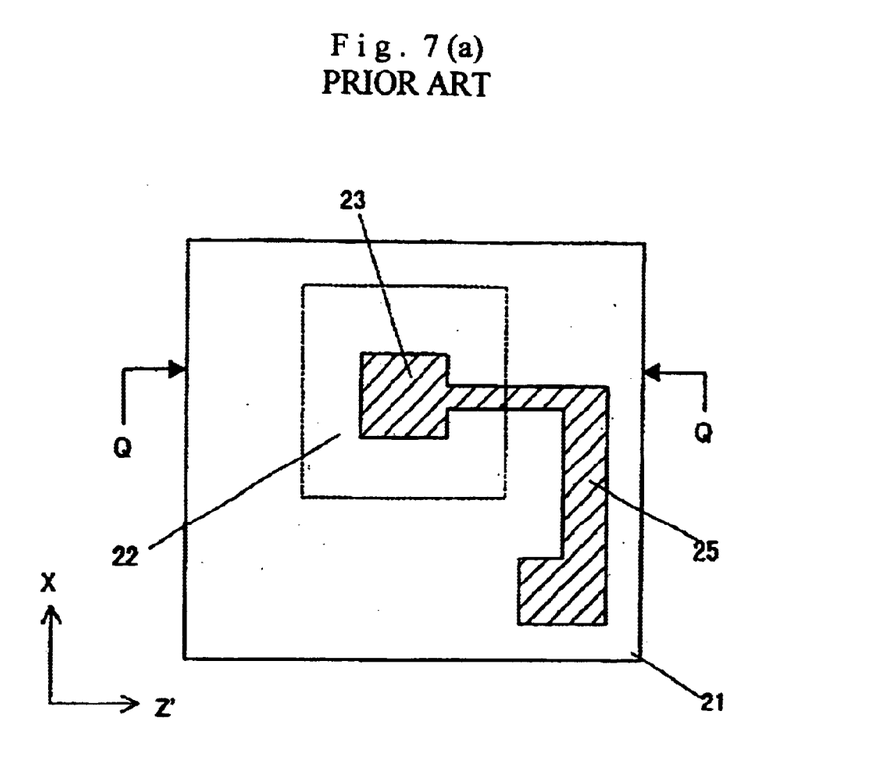
FIGS. 7(a) and 7(b) are views illustrating the construction of a conventional AT cut high frequency crystal resonator, FIG. 7(a) being a plan view thereof and FIG. 7(b) being a sectional view thereof.
Figure 7B:
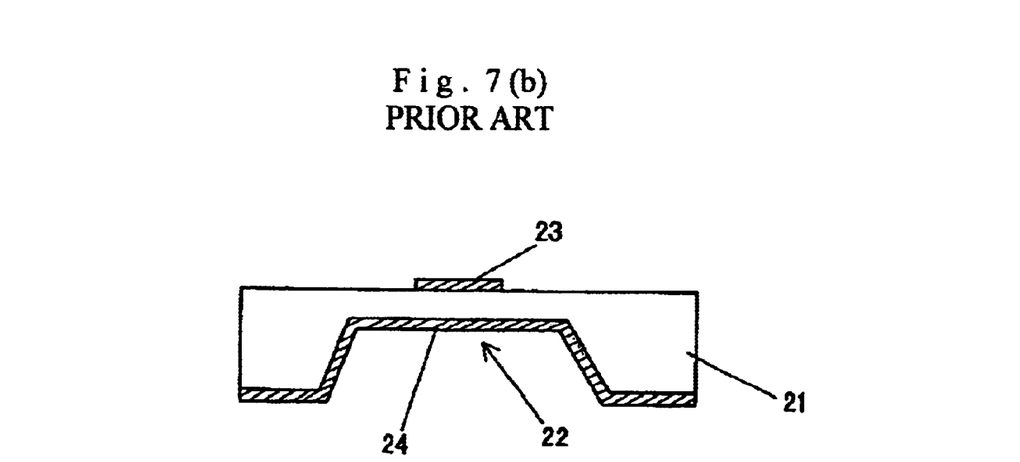

FIGS. 7(a) and 7(b) are views illustrating the construction of a conventional high frequency AT cut crystal resonator, FIG. 7(a) being a plan view and FIG. 7(b) being a sectional view. Part of a main surface of a crystal plate 21 is recessed using, for example, a photolithography technique and method of etching. The portion of the substrate 21 corresponding to this recess 22 is made to be an ultra-thin vibration portion. This portion of the plate 21 and a thick annular surrounding portion that retains the area around that vibration portion are formed integrally with each other. On one main surface (flat surface) of the crystal plate 21 there is disposed an electrode 23. From the electrode 23 there is extended toward the edge of the plate 21 a lead electrode 25. Further, on the other surface of the substrate 21, i.e., on the surface having therein the recess 22, there is formed an entire electrode 24.

It is to be noted that the energy trapping of the AT cut high frequency crystal resonator having a structure illustrated in FIG. 7, as well known, depends only upon the mass loading of the electrode 23 and not upon the mass loading of the entire electrode 24 on the other surface.

Figure 8:
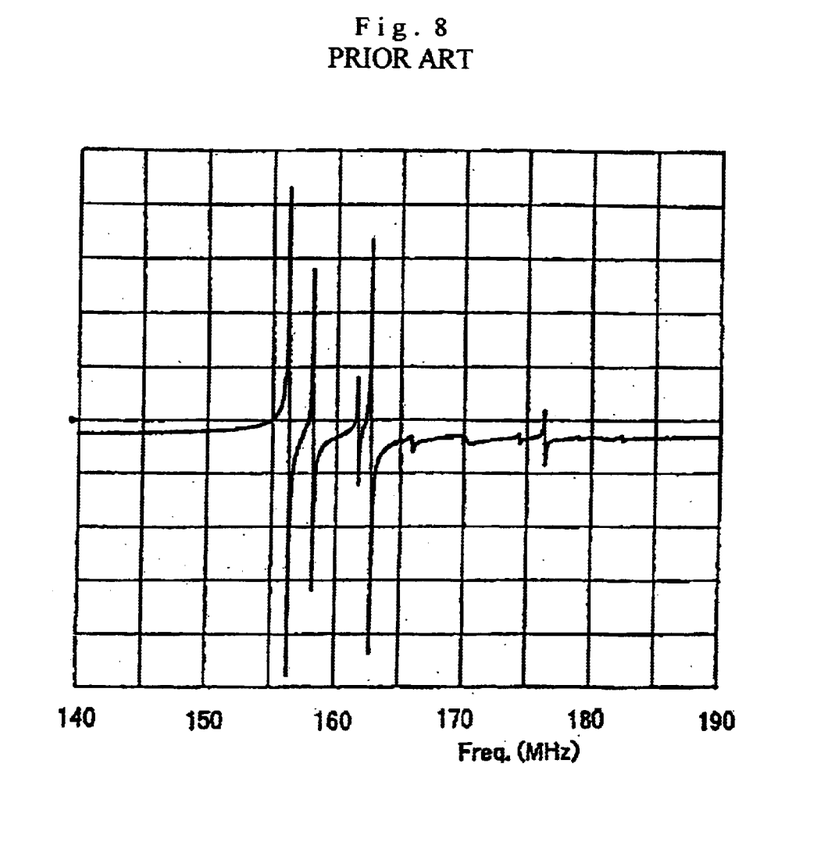
FIG. 8 is a view illustrating a frequency spectrum of the conventional AT cut high frequency crystal resonator.

FIG. 8 is a view illustrating a measured example of the frequency spectrum of the AT cut high frequency crystal resonator having the structure illustrated in FIG. 7. The resonance frequency is set to be 156.6 MHz (the thickness of the crystal plate 21 is set to be approximately 10 μm); the dimension in the X-axial direction of the electrode 23 is set to be 0.55 mm; the dimension in the Z'-axial direction is set to be 0.435 mm; and as the electrode 23 there was adhered a thin film of gold having a thickness of 600 Å on a backing layer of nickel having a thickness of 50 Å. It is to be noted that the material of the film constituting the entire electrode 24 was also formed substantially in the same way.

As obvious from the frequency spectrum of FIG. 8, from the fundamental mode up to a large number of inharmonic modes fall within the range of the energy trapping mode. These modes, as seen, are sharply excited as spurious. Using this crystal resonator as one component of the oscillator, there is the possibility that the phenomenon of the frequency jump will occur.

As a method of analyzing a spurious mode in the thickness shear resonator such as that illustrated in FIG. 8, there is well known an energy trapping theory, which will briefly be explained below.

Figure 9:
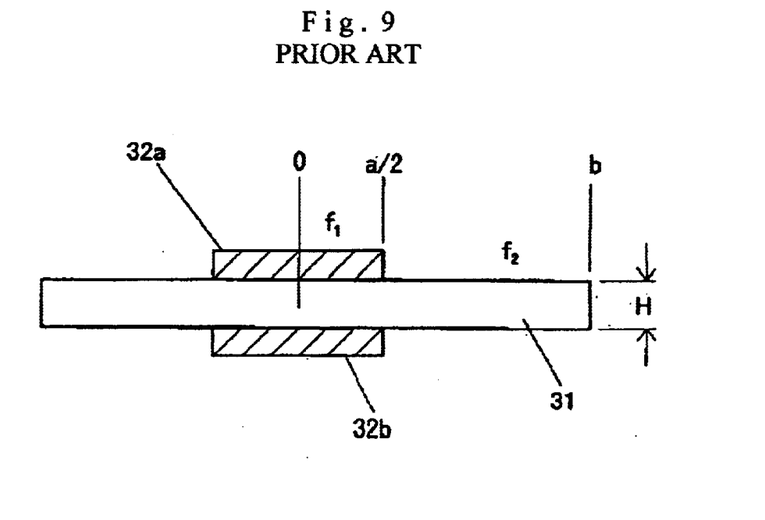
FIG. 9 is a sectional view illustrating a crystal resonator for explaining an energy-confining theory.

FIG. 9 is a sectional view illustrating the section of an ordinary AT cut crystal resonator. The diameter of a circular crystal plate 31 having a thickness of H is set to be 2b; the diameter of an electrode 32 that has been adhered thereto is set to be a; and the cutoff frequencies of the electrode 32 portion and the plate 31 portion are set to be $f_1$ and $f_2$, respectively. Generally, the plate-back Δ, the energy trapping coefficient ζ and the normalized frequency ψ are expressed as follows.

$$\Delta = \frac{(f_2 - f_1)}{f_1} \quad (1)$$

$$\zeta = \frac{na}{H}\sqrt{\Delta} \quad (2)$$

$$\phi = \frac{(f - f_1)}{(f_2 - f_1)} \quad (3)$$

Figure 10:
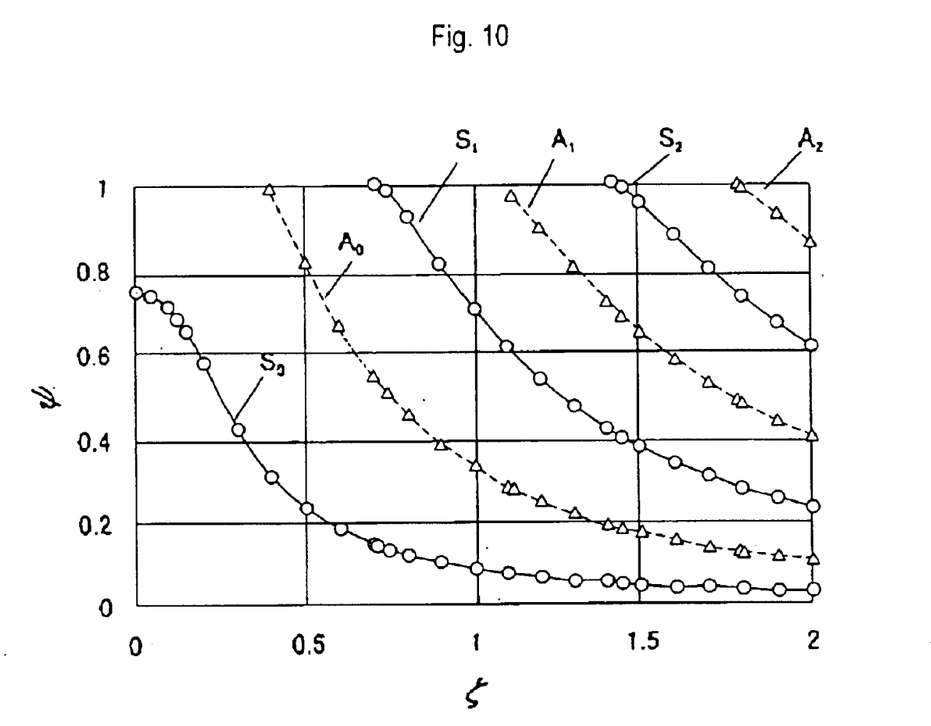
FIG. 10 is a view illustrating a frequency spectrum of a conventional crystal resonator, the frequency spectrum being the one that has been obtained by calculation.

In the equation No. 2, n represents the order of the overtone mode. When the mode is the fundamental mode, n=1. FIG. 10 illustrates a frequency spectrum of the crystal resonator having the structure of FIG. 9, as determined by calculation, with the energy trapping coefficient ζ being plotted along the abscissa and the normalized frequency ψ being plotted along the ordinate. Generally, in order to design an resonator wherein spurious less occur, using the energy trapping coefficient ζ=0.707 that is immediately before the symmetrical 1st mode $S_1$ starts to be trapped is admitted as being preferable.

Here, FIG. 10 illustrates the results that have been obtained by the calculation that has been performed on the premise that the substrate be an isotropic elastic body. However, if applying this method of determining the frequency spectrum to an anisotropic piezoelectric plate such as a crystal, it is well known that it is sufficient to multiply each length by an anisotropic constant to thereby correct this length. For instance, with respect to the thickness twist mode and the thickness shear mode of the crystal resonator, their respective optimum energy trapping coefficients ζ are said to be 2.4 and 2.8.

Determining the energy trapping coefficient ζ of the high frequency crystal resonator illustrated in FIG. 8 according to the equation (2) as a trial, the ζ=5.7. It is seen that this value is the one that is much greater than the optimum value. Therefore, as stated above, a high order of vibration mode also becomes an energy-confining mode, whereby a large number of spurious are sharply excited.

On the other hand, in order to improve the spurious characteristic of the AT cut crystal resonator, a piezoelectric resonator that can somewhat arbitrarily control the frequency of the generated spurious regardless of the length, film thickness, etc. of the electrode has been proposed in Japanese Patent Application Laid-Open Nos. Hei-9-27729 and Hei-9-93076.

Figure 11A:
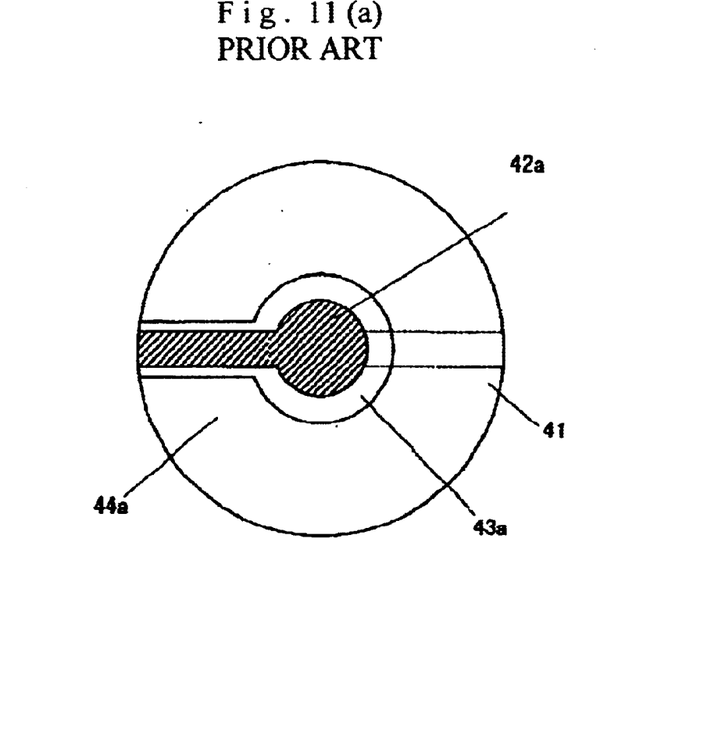
FIGS. 11(a) and 11(b) are views illustrating the construction of a conventional spurious suppression type piezoelectric resonator, FIG. 11(a) being a plan view thereof and FIG. 11(b) being a sectional view thereof.
Figure 11B:
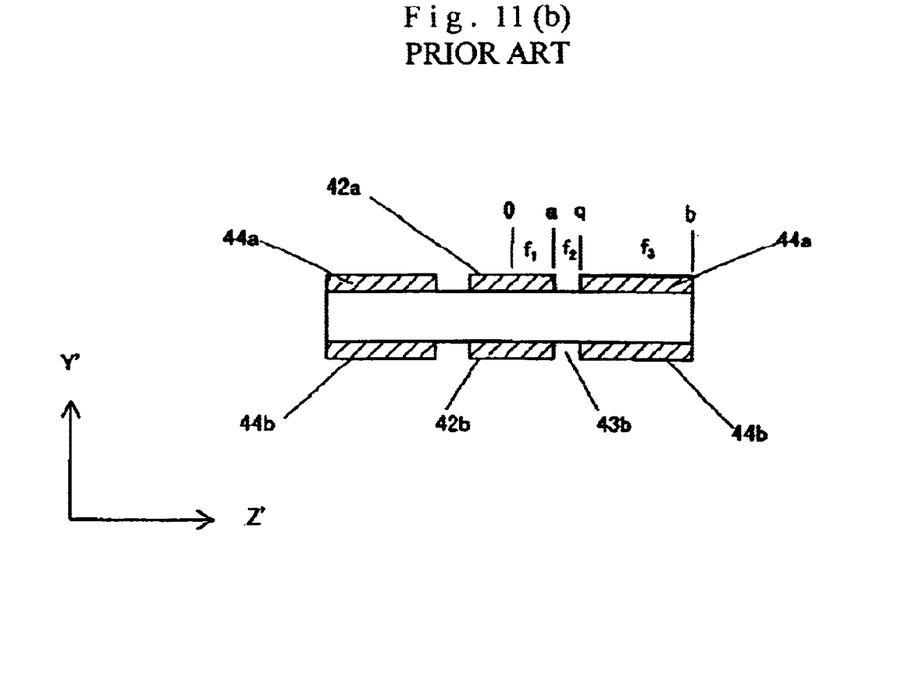

FIG. 11(a) is a plan view illustrating a crystal resonator that is as proposed above and FIG. 11(b) is a sectional view thereof. On both surfaces of the central parts of a crystal plate 41 there are disposed main electrodes 42a and 42b. Simultaneously, second electrodes 44a and 44b are disposed so as to surround the peripheral edges of those electrodes 42a and 42b and with a gap between the both. The respective cutoff frequencies of the main electrodes 42a, 42b, gap portion, and second electrodes 44a, 44b are set to be $f_1$, $f_2$, and $f_3$, as illustrated in FIG. 11(b). Here, the thickness of the electrode films are set so that the relationship among the cutoff frequencies of $f_1 < f_3 < f_2$ holds true among the cutoff frequencies.

Also, the second amount Δ2 of decrease in frequency and the depth v of the gap (hereinafter referred to as "a groove depth") are respectively defined as follows.

$$\Delta 2 = \frac{(f_3 - f_1)}{f_1} \quad (4)$$

$$v = \frac{(f_2 - f_3)}{(f_3 - f_1)} \quad (5)$$

According to the above official gazettes, whatever value the mass loading (the film thickness) of the main electrode 42a, 42b is set to be at, only if appropriately setting the mass loading (the film thickness) of the second electrode 44a, 44b correspondingly, it becomes possible to decrease the amount Δ2 of decrease in frequency, which participates in the energy trapping coefficient ζ, down to a desired value. The above official gazettes describe that therefore it becomes possible to easily control the energy trapping coefficient ζ and hence to manufacture a crystal resonator the spurious of that are less. Further, the above official gazettes describe that, by aptly setting the groove depth v and the ratios q/a and b/a of the distance q and b of the main electrode 42a, 42b with respect to the both edges of the second electrode 44a, 44b, it is possible to somewhat arbitrarily control the value of the energy trapping coefficient ζ permitting the generation of a symmetric high-order mode and anti-symmetric mode. Therefore, if adopting this proposal, it results that only desired main vibration waves can be excited with a high level of power without making an inharmonic mode trapped mode.

However, applying the above proposal to a high frequency 150-MHz band crystal resonator and determining the plate-back Δ2 using the electrode configuration of FIG. 8 with the energy trapping coefficient ζ being set to be 0.521, this plate-back Δ2 becomes Δ2=0.00144. If using a thin film of gold for both the main electrode and the second electrode, the difference in film thickness between the main electrode and the second electrode becomes 21.8 Å. To realize this difference in film thickness, a precision of 10% or so becomes necessary with respect to the value of the difference. This value goes beyond a limit of control that is possible with an ordinary evaporating or sputter apparatus. Also, even when having used the value, which is immediately before the $S_1$ mode is trapped, as the energy trapping coefficient ζ, recognizing the generation of the oblique-symmetrical $A_0$ mode, the difference in film thickness between the main electrode and the second electrode is as very small as 40 Å. Controlling such a small film thickness difference with a precision of 10% or so is virtually impossible. Even if a film-forming apparatus enabling such control to be made has been developed, there was the problem that such an apparatus became very expensive.

Also, in case that forming a AT cut high frequency crystal resonator such as that illustrated in FIG. 7 using method of etching, the crystal plate prior to etching is etched until its thickness becomes 10 μm while maintaining the surface configuration of the substrate, for example, 80 μm thick as it is. Therefore, the unevenness in the flatness and the parallelism, which did not become very problematic with the substrate 80 μm thick, becomes relatively very greatly problematic when the same is viewed from the etched plate that has become 10 μm thick. Resultantly, anti-symmetrical modes $A_0$ and $A_1$ of vibration, which in an ordinary crystal resonator didn't become problematic due to cancellation of the electric charges, appear as vigorous spurious in the thin portion which vibrates. For this reason, the following problem arose. Namely, as the energy trapping coefficient ζ that is optimum to suppressing the occurrence of spurious, the value that is immediately before the symmetrical 1st mode $S_1$ starts to be trapped is not adequate. In other words, a sufficiently small value of energy trapping coefficient ζ must be used so that the anti-symmetric mode $A_0$ does not become trapped.

SUMMARY OF THE INVENTION

The present invention has been made in order to solve the above-described problems and has an object to provide an AT cut high frequency crystal resonator wherein the occurrence of spurious is less.

To attain the above object, according to the first aspect of the invention, there is provided a high frequency piezoelectric resonator, the piezoelectric resonator including a piezoelectric plate having disposed on its main surfaces, respectively, mutually opposing main electrodes for the excitation, a pair of second electrodes being each disposed surrounding the peripheral edge of its corresponding main electrode with a gap in between, wherein the material of the main electrode and the material of the second electrode are different from each other.

According to the second aspect of the invention, there is provided a high frequency piezoelectric resonator according to the first aspect, wherein the density of the material of the second electrode is made lower than that of the main electrode.

According to the third aspect of the invention, there is provided a high frequency piezoelectric resonator according to the first or second aspect, wherein the piezoelectric plate is made a piezoelectric plate having formed therein a recess.

According to the fourth aspect of the invention, there is provided a high frequency piezoelectric resonator according to the first to third aspects, wherein the configuration of the main electrode is made elliptic.

According to the fifth aspect of the invention, there is provided a high frequency piezoelectric resonator including a piezoelectric plate, one main surface of the piezoelectric plate being recessed to thereby form a thin portion therein, the main surface opposing the recess corresponding to the thin portion having formed thereon at its central portion a convex portion, the convex portion having formed thereon a main electrode for the excitation, a lead electrode being extended from the main electrode toward an edge of the plate, a second electrode being so provided as to surround the main electrode and the lead electrode with a gap in between, the piezoelectric plate having applied on a recess side thereof an entire electrode.

According to the sixth aspect of the invention, there is provided a high frequency piezoelectric resonator according to the fifth aspect, wherein the convex portion is made elliptic.

According to the seventh aspect of the invention, there is provided a high frequency piezoelectric resonator according to the first to sixth aspects, wherein the second electrode is divided into a plurality of portions; and adjustment of frequency is performed of these electrode portions.

DESCRIPTION OF THE PREFERRED EMBODIMENTS

The present invention will now be explained in detail on the basis of the embodiments illustrated in the drawings.

Figure 1A:
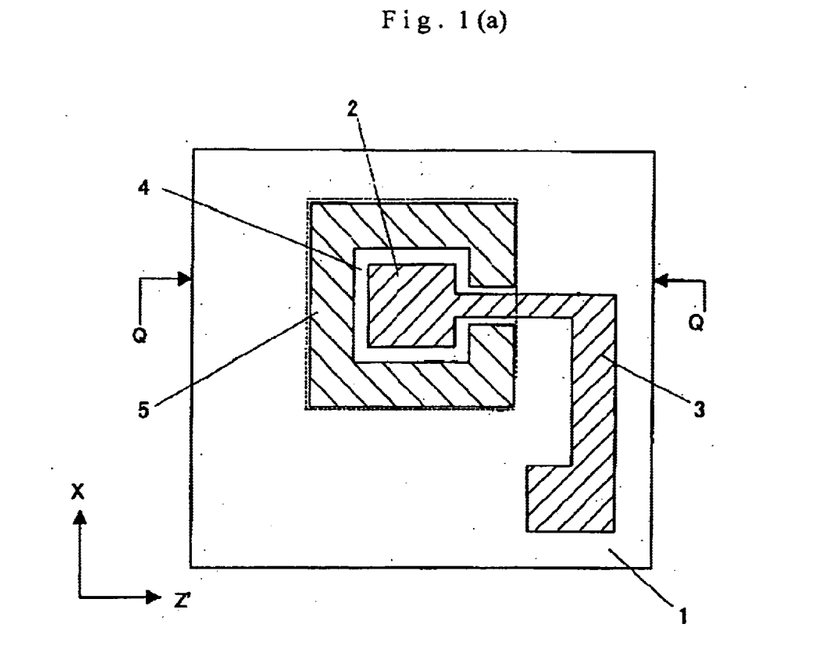
FIG. 1(a) is a plan view illustrating the construction of an AT cut high frequency crystal resonator according to the invention.
Figure 1B:
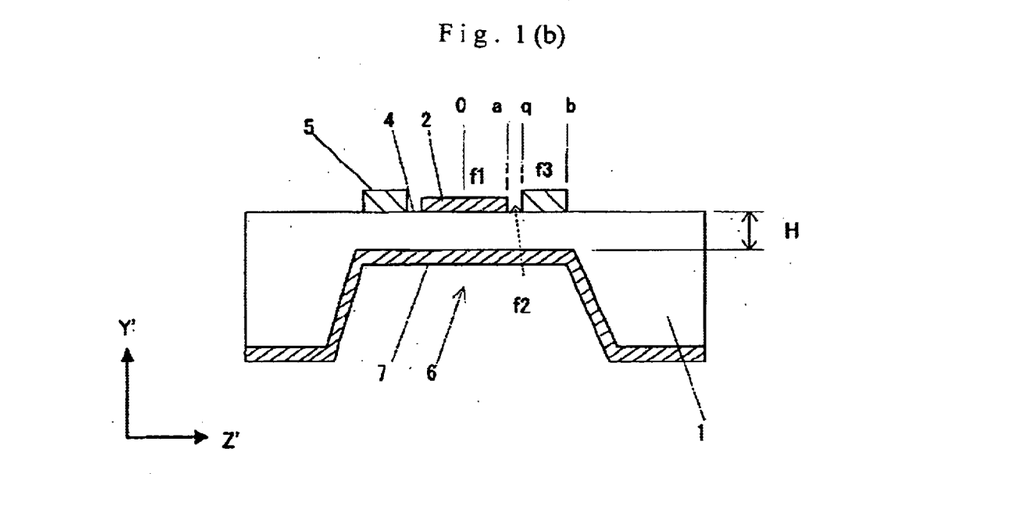
FIG. 1(b) is a sectional view thereof.

FIGS. 1(a) and 1(b) are views illustrating the construction of an AT cut high frequency crystal resonator according to the invention, and FIG. 1(a) being a plan view thereof and FIG. 1(b) being a sectional view taken along a line Q—Q. On a flat-surface side of a crystal plate 1 the other surface of that has formed therein a recess, there is disposed a main electrode (an excitation electrode) 2. From the electrode 2 there is extended toward an edge of the crystal plate 1 a lead electrode 3. Further, a second electrode 5 is so provided as to surround the peripheral edge of the main electrode 2 with a gap 4 in between. The size of the electrode 5 is made substantially the same as that of the recess 6 formed in the crystal plate 1. And, on a recess side there is formed an entire electrode (an excitation electrode) 7.

The respective dimensions of the main electrode 2, gap 4, and second electrode 5 are set as illustrated in FIG. 1(b). Namely, the thickness of the crystal plate 1 is set to be H, and the respective configurations of the main electrode 2, gap 4 and second electrode 5 are each made symmetrical with respect to a Z'-axial direction. Further, the length from a center of the main electrode 2 to an edge of it is set to be a; and the dimensions from the center of the main electrode 2 to an inner side edge and an outer side edge of the second electrode 5 are respectively set to be q and b.

The characterizing feature of the present invention resides in that the material quality of the main electrode (excitation electrode) 2 and that of the second electrode 5 are differentiated from each other. More specifically, the characterizing feature is that the second electrode 5 has been formed using a material constructed of a film, the density of that is lower than that of the film that the main electrode 2 is constructed of. For example, taking the aging of the crystal resonator into consideration, a thin film of gold is used as the material of the main electrode 2 and a thin film of silver is used as the material of the second electrode 5 whose effect upon the aging characteristic is small. Because the density of gold and that of silver are respectively 19.32 g/cc and 10.50 g/cc, constructing like that, the film thickness of the second electrode 5 becomes approximately twice as large as the thickness of the main electrode 2. Therefore, compared to a case where having used a thin film of gold as each of the both electrodes, it becomes much easier to control the thickness of each film that takes part in energy trapping.

To restrict the object waves of the energy-trapped mode to only the main vibration alone, it is necessary to make the film thickness of the second electrode 5 greater than that of the main electrode 2. But it is necessary to set the cutoff frequencies of the both electrodes so that the cutoff frequency $f_3$ of the second electrode 5 may be higher than the cutoff frequency $f_1$ of the main electrode 2. Assuming that $f_2$ represents the cutoff frequency of the gap portion 4, it is necessary that the relationship among the respective cutoff frequencies be $f_1 < f_3 < f_2$.

Here, it is confirmed by simulation to what extent the control of the film thickness becomes easy compared to that of the conventional piezoelectric resonator.

Setting the center of the main electrode 2 to be the origin (0) and the dimensions of the respective electrode portions to be as stated previously as illustrated in FIG. 1(b) and assuming that the crystal plate 1 be an isotropic elastic body, one dimensional analyses of the thickness shear mode were performed. In the Japanese Patent Application Laid-Open No. Hei-9-27729 that is previously cited, analysis is made using the frequency equation that has been established under the assumption that the edge of the substrate be a free edge. However, in the case of a resonator wherein the periphery of the vibration portion is retained by the annular surrounding portion as in the invention, the frequency equation should be established under the assumption that the edge of the vibration portion be a fixed edge. Accordingly, the frequency equation is as follows.

$$\frac{k_2}{k_1}\cot k_1 a = \frac{\tanh k_2(q-a) + \frac{k_2}{k_3}\tanh k_3(b-q)}{1 + \tanh k_2(b-q) \cdot \frac{k_2}{k_3}\tanh k_3(b-q)} \tag{6}$$

In this frequency equation, through the assumption that the edge of the plate be a fixed edge, the phenomenon that the waves are reflected by the edge surface and the phase thereof is inverted there is taken into consideration. Here, the wave numbers $k_1$, $k_2$, and $k_3$ are respectively the propagation constants (wave numbers) of the main electrode 2 portion, gap 4 portion, and second electrode 5 portion.

Figure 2:
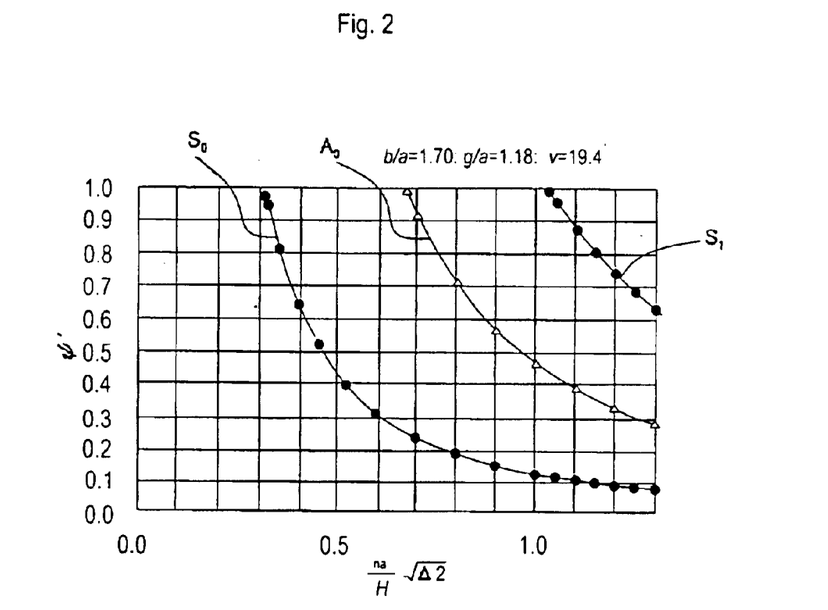
FIG. 2 is a view illustrating a frequency spectrum of the crystal resonator having a structure of FIGS. 1(a) and 1(b), the frequency spectrum being the one that has been obtained by calculation.

FIG. 2 illustrates the frequency spectra of the main vibration $S_0$, anti-symmetric 0th mode $A_0$, and symmetric 1st mode $S_1$ under the assumption that b/a=1.7 and q/a=1.18 respectively representing the ratios between the length values and v=29.4 representing the groove depth be used as the parameters and that $\zeta$ representing the energy trapping coefficient be plotted along the abscissa and $\psi$ representing the normalized frequency be plotted along the ordinate. Here, the normalized frequency $\psi'$ is expressed as the following equation.

$$\phi' = \frac{(f - f_1)}{(f_3 - f_1)} \qquad (7)$$

It is to be noted that, as stated previously, the energy trapping coefficient ζ of the abscissa is given as a value that has been obtained using an isotropic plate, and that, in case that having used a substrate having anisotropy such as that made of crystal, this value has only to be corrected by multiplying the energy trapping coefficient ζ by an anisotropy constant.

Another characterizing feature of the present invention resides in that there has been changed the value of the energy trapping coefficient ζ that has hitherto been generally accepted in order to suppress the anti-symmetric mode. When the resonance frequency becomes as high as 150 MHz, unlike the contents that are stated in the Japanese Patent Application Laid-Open Nos. Hei-9-27729 and Hei-9-93076, the unevenness in the flatness and the parallelism of the plate occurs and the lead electrode 3 comes to participate in the generation of the anti-symmetric mode. Resultantly, the anti-symmetric mode becomes also excited. The reason for this is as follows. When the physical symmetry collapses due to the unevenness in the flatness and the parallelism of the plate or to the lead electrode, the anti-symmetric mode does not become a complete anti-symmetric mode either. Resultantly, the produced electric charges are not completely mutually cancelled by the electrode, with the result that an anti-symmetrical mode becomes excited.

Therefore, as the value of the energy trapping coefficient ζ, it becomes necessary to use not a value that is immediately before the $S_1$ mode starts to be trapped and that is conventionally generally accepted but a value that is smaller than that value. Namely, using this smaller value, it becomes necessary to suppress the production of the anti-symmetric $A_0$ mode. Desirably, as the value of the energy trapping coefficient ζ, a value that is immediately before the waves in the anti-symmetric $A_0$ mode starts to be trapped is used. Namely, if under the conditions illustrated in FIG. 2 wherein b/a=1.7, q/a=1.18, and ν=29.4, the value of the energy trapping coefficient ζ=0.67 or so is optimum. The value of the optimum energy trapping coefficient ζ of the high frequency piezoelectric resonator according to the invention cannot primarily be determined, unless the relevant conditions such as b/a, q/a, or ν are determined, unlike the case where the resonator uses a single electrode.

Figure 3:
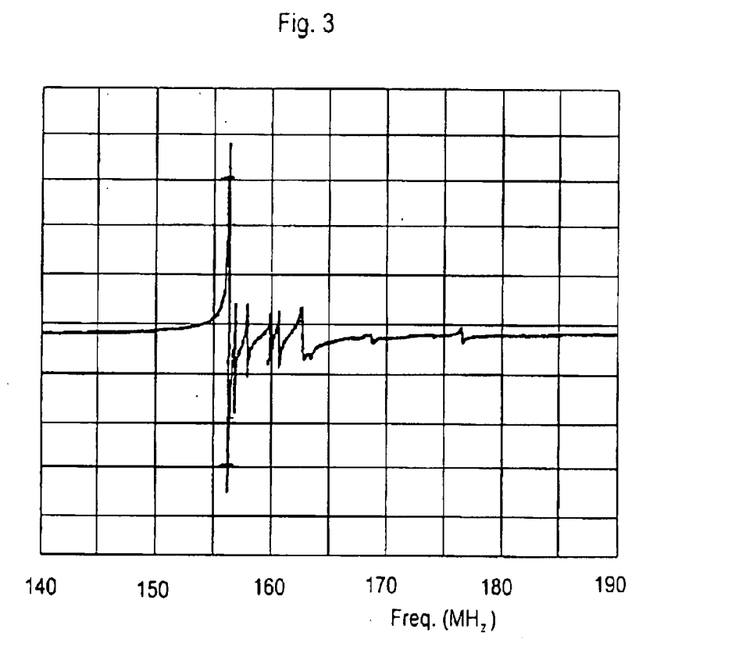
FIG. 3 is a view illustrating a frequency spectrum of the crystal resonator having a structure of FIGS. 1(a) and 1(b), the crystal resonator being the one that has been manufactured and the frequency spectrum of that has been measured.

FIG. 3 is a view illustrating a frequency spectrum of the AT cut high frequency crystal resonator according to the invention. The resonance frequency is set to be 156.6 MHz (the thickness of the crystal plate 1 is set to be approximately 10 μm) while the dimension in the X-axial direction and the dimension in the Z'-axial direction of the electrode 2 are set to be 0.55 mm and 0.435 mm, respectively. As the electrode 2, there is adhered a backing layer made of nickel 50 Å thick and there is adhered thereon a thin film of gold 600 Å thick. As the second electrode 5, there is adhered a backing layer of nickel 50 Å thick and there is adhered thereon a film of silver 1100 Å. The dimensions of the respective portions are set such that b/a=1.7; and q/a=1.18. At this time, the energy-trapping coefficient ζ is 0.521, and it is seen from FIG. 2 that the anti-symmetric 0th mode $A_0$ is not confined. It is to be noted that the films constituting the entire electrode 7 have been formed substantially in the same way as in the case of the films constituting the main electrode 2.

Comparing to FIG. 8, it is seen that although the constant of the main electrode 2 is the same, the production of the spurious is excellently suppressed. At this time, the equivalent resistance R1 of the main vibration is approximately 15Ω. So, no deterioration of the equivalent resistance of the main vibration due to the suppression of spurious was confirmed.

Also, the thickness of the film of gold of the main electrode 2 is 600 Å and the thickness of the film of silver of the second electrode 5 is 1100 Å. Namely, unlike the above-described official gazettes, in the present invention, both the main electrode and the second electrode have a film thickness that is sufficiently controllable and can therefore be easily manufactured with a conventional evaporating or sputter apparatus.

Figure 4A:
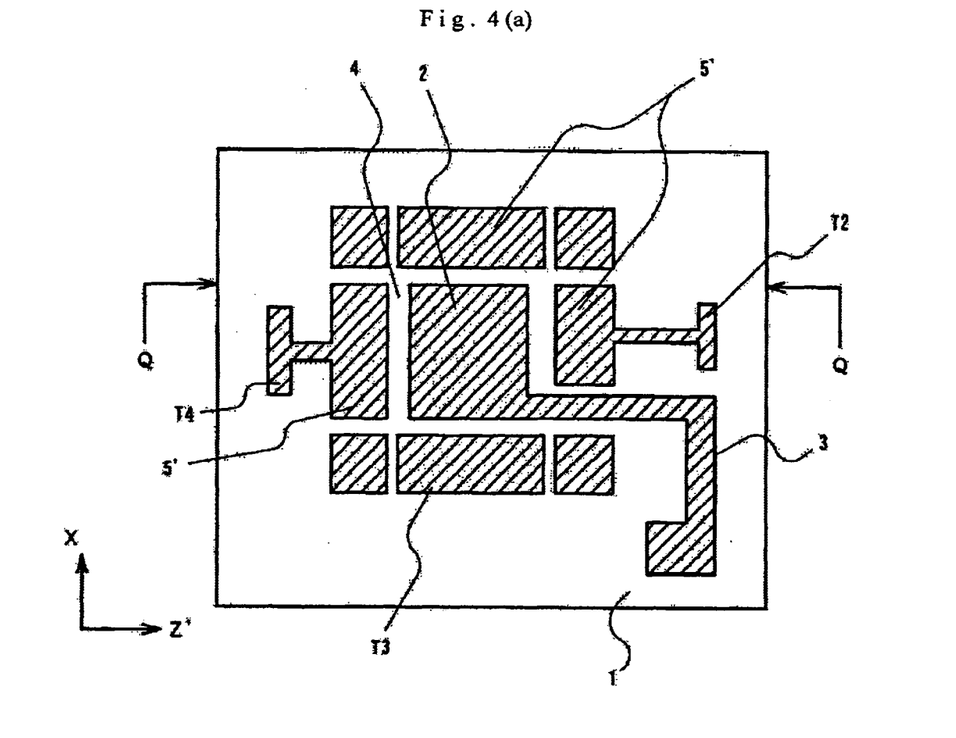
FIGS. 4(a) and (b) are plan view illustrating the construction of two embodiment of the invention.
Figure 4B:
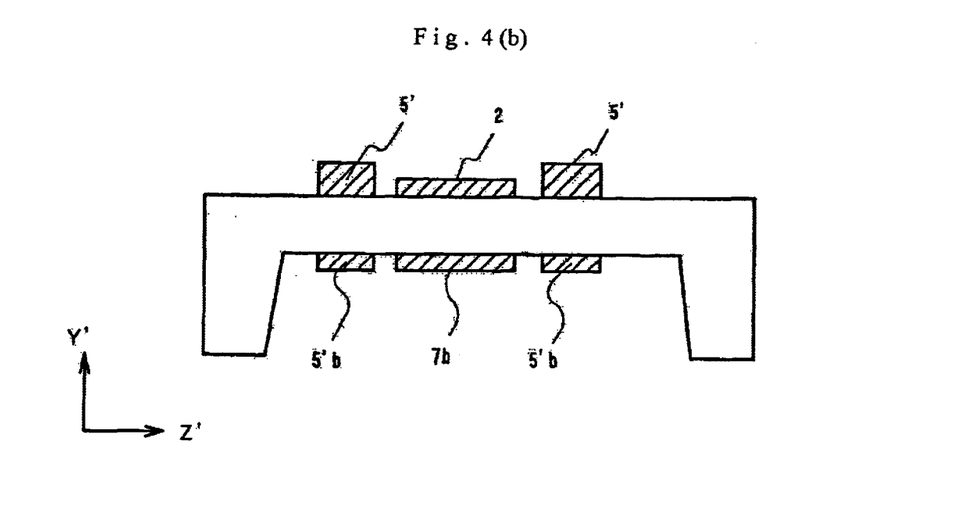

FIGS. 4(a) and 4(b) are plan views illustrating the construction of two versions of a second embodiment of the invention. In a first version of this second embodiment in FIG. 4(a), the second electrode 5 of FIG. 1 is divided to thereby provide divisional electrodes 5', 5', . . . , and lead electrodes T1, T2, T3, and T4 are provided with respect thereto. In case that there are slight irregularities or unevenness in the flatness and the parallelism of the crystal plate 1, or in case that there is non-uniformity in the films of the electrodes, the production of spurious due to the anti-symmetric mode can he suppressed by adjusting the frequencies of the second electrode 5', 5', . . . For instance, in case that spurious has occurred in a high frequency resonator that has been manufactured, the following countermeasures can be taken. Using the terminals T1, T2, T3, and T4 illustrate in FIG. 4(a), there is measured the frequency of such resonator. And only if finely adjusting the high-value portions of this frequency by methods of evaporating, etc. it would be sufficient. Similarly to FIG. 4(a), in the second version of FIG. 4(b), a plurality of second electrodes 5'b are provided on the crystal plate 1 opposing the plurality of second electrode 5' together with another electrode 7b.

Figure 5:
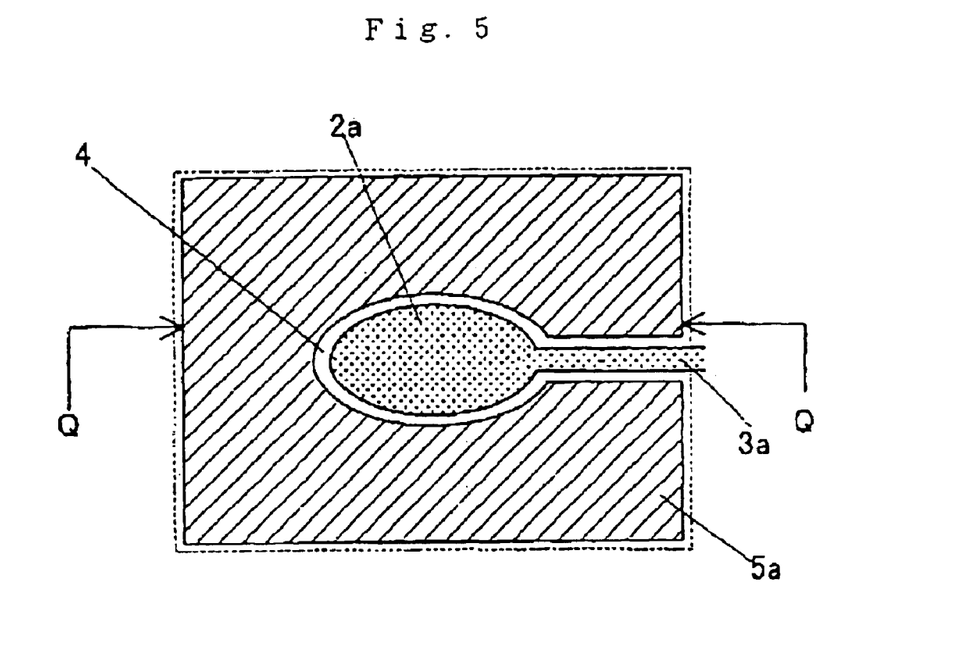
FIG. 5 is a plan view illustrating a main part of the construction of a third embodiment of the invention.

FIG. 5 is a plan view illustrating the main electrode and second electrode constituting a main part of the piezoelectric resonator according to a third embodiment of the present invention. The difference of FIG. 5 from FIG. 1 is that an elliptic main electrode (an excitation electrode) 2a is disposed as the main electrode (excitation electrode) 2 illustrated in FIG. 1(a). This difference further resides in that an elliptic groove hole is formed in the central part of the plate so as to surround the peripheral edge of the main electrode 2a with a gap. That difference further resides in that a second electrode 5a substantially corresponding to the recess 6 of the crystal plate 1 is disposed around the main electrode 2a with the elliptic groove hole in between. That an entire electrode is disposed over the recess of the crystal plate is the same as in FIG. 1.

The reason for having made the main electrode 2a elliptic is as follows. Determining the two-dimensional vibration displacement distribution of the main vibration, as an attempt, by applying a finite element method, it is seen that the displacement distribution of the main vibration is elliptical due to the anisotropy of the crystallographic axis of the crystal plate. Therefore, manufacturing a high frequency resonator wherein the main electrode is formed elliptic in conformity with the displacement distribution of the main vibration and the second electrode is formed with an elliptical hole that surrounds the main electrode with a gap formed in between, the production of spurious is suppressed. Resultantly, a resonator whose capacitance ratio is minimal is obtained.

Figure 6A:
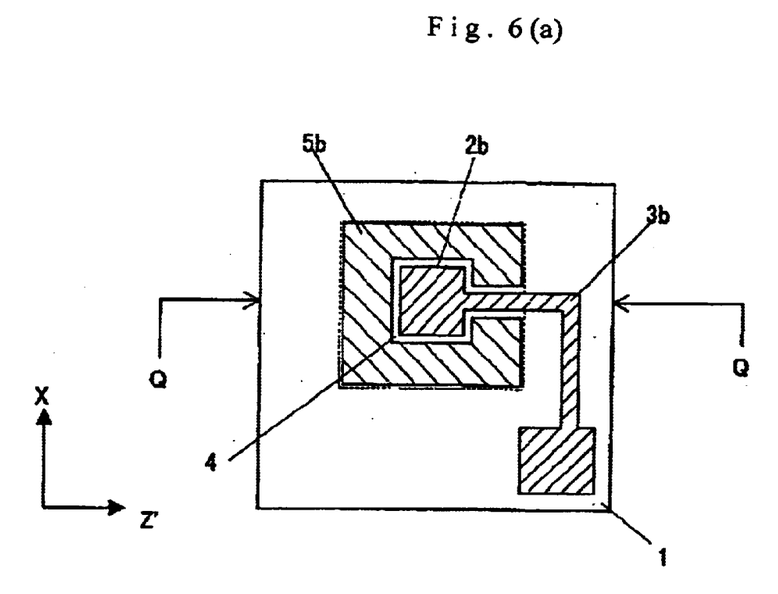
FIG. 6(a) is a plan view illustrating the construction of a fourth embodiment of the invention.
Figure 6B:
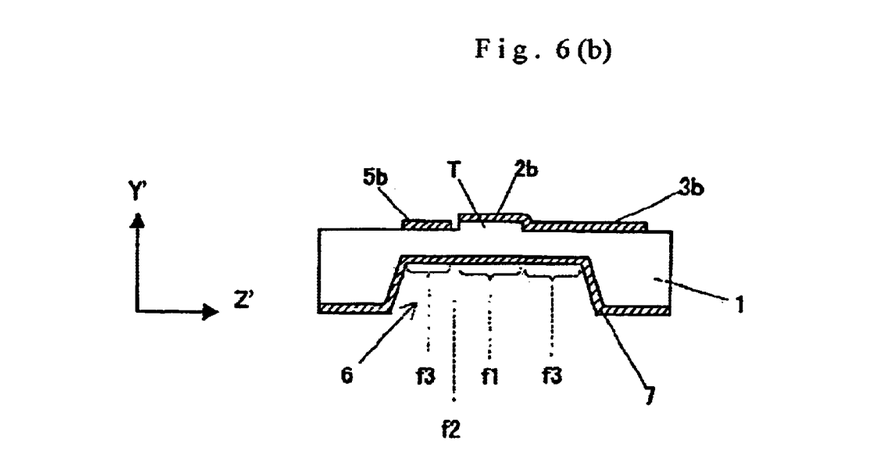
FIG. 6(b) is a sectional view thereof.

Also, FIG. 6(a) is a plan view illustrating the construction of a fourth embodiment of the present invention and FIG.

6(b) is a sectional view taken along a line Q—Q. Using methods of etching, etc., on a substantially central part of one main surface of the crystal plate 1 there is formed a convex portion T and, on the other main surface thereof, there is formed a recess 6. Thereafter, on the convex portion T, there is disposed a main electrode (an excitation electrode) 2b, and, from the electrode 2b, there is extended toward the edge of the crystal plate 1 a lead electrode 3b. Thereafter, a second electrode 5b is so provided as to surround the peripheral edges of the main electrode 2b and the lead electrode 3b in such a way as to provide a gap between the both. Further, an entire electrode (an excitation electrode) 7 is formed on a recess side of the crystal plate 1, to thereby construct a high frequency crystal resonator.

The characterizing feature of the fourth embodiment is as follows. After forming the convex portion T on the crystal plate 1 beforehand, the main electrode 2b is formed on the convex portion T. Therefore, even when making the main electrode 2b, lead electrode 3b, and second electrode 5b the same in material quality and in film thickness, the respective cutoff frequencies thereof have the relationship of f1<f3<f2. Resultantly, it has become possible to satisfactorily achieve the relevant edge by performing the evaporating or sputtering and photolithography, respectively, only once.

Also, the cutoff frequency f1 of the main electrode 2b region and the cutoff frequency f3 of the lead electrode 3b region are made to be in a relationship of f1<f3. Resultantly, it has become possible to decrease the leaking vibration energy of the main vibration by propagating the lead electrode region 3b. Resultantly, it is advantageously possible to not only suppress the production of spurious but also make greater the Q value of the main vibration at the same time.

In FIG. 6(a), illustration has been made of the rectangular main electrode 2b. However, the present inventor's simulation and experiment performed using a finite element method have confirmed that the capacitance ratio or spurious is able to be improved if forming an elliptic electrode such as that of FIG. 5 as the main electrode.

In the foregoing description, an explanation has been given of an example wherein the invention has been applied to the high frequency fundamental crystal resonator in 150 MHz band. However, the invention is not limited to this resonator only but can be also applied to a crystal resonator of every frequency and of overtone in VHF band and UHF band.

Also, in the foregoing description, an explanation has been given of a case where a recess is formed in one surface of the crystal plate. However, the invention can needless to say be also applied to a case where a recess portion is formed in each surface of the crystal plate. Also, the configuration of the main electrode and second electrode is not limited to a rectangular configuration alone but may be a circular configuration. Further, a case where an entire electrode has been applied to the recess side has been explained. However, onto each surface, there may be applied a partial electrode. Although a case where gold and silver are used as the material of the electrodes has been explained, the material of the electrodes may be aluminum, titanium, copper, etc. or an alloy of these elements. Also, the method of forming a film or films for the electrodes by the use of such material may be any given type such as evaporating, or sputtering.

Although in the foregoing description a high frequency resonator has been explained, it is obvious that when applying the invention to a high frequency multiple-pole monolithic filter there is the effect of spurious being suppressed.

Since the present invention has been constructed as described above, manufacturing an AT cut high frequency crystal resonator with spurious being kept suppressed has become possible. If using the crystal resonator of the invention in a voltage controlled crystal resonator, etc., the excellent effect that a high-stability, high frequency, and broadband VCXO apparatus can be manufactured is brought about.

What is claimed is:

1. A high frequency piezoelectric resonator, the piezoelectric resonator including a piezoelectic plate having disposed on its main surfaces, respectively, mutually opposing main electrode for the excitation and at least one second electrode disposed surrounding the peripheral edge of its corresponding main electrode with a gap in between wherein:

the material of the main electrode and the material of the second electrode are different from each other; and the density of the material of the second electrode is made lower than that of the main electrode; and wherein $<f_1<f_3<f_2$ is satisfied in which cutoff frequency of the main electrode is $f_1$, a cutoff frequency of the second electrode is $f_3$.

2. A high frequency piezoelectric resonator according to claim 1, wherein the piezoelectric plate is made of a piezoelectric plate having formed therein a recess.

3. A high frequency piezoelectric resonator according to claim 1 or 2, wherein the configuration of the main electrode is made elliptic.

4. A high frequency piezoelectric resonator including a piezoelectric plate, one main surface of the piezoelectric plate being recessed to thereby form a thin portion therein, the main surface opposing the recess corresponding to the thin portion having thereon at its central portion a convex portion formed integrally with the piezoelectric plate, the convex portion having formed thereon a main electrode for the excitation, a lead electrode being extended from the main electrode toward an edge of the plate, a second electrode being so provided as to surround the main electrode and the lead electrode with a gap in between, the piezoelectric plate having applied on a recess side thereof an entire electrode; wherein the density of the material of the second electrode is made lower than that of the main electrode; and wherein $<f_1<f_3<f_2$ is satisfied in which a cutoff frequency of the main electrode is $f_1$, a cutoff frequency of the gap is $f_2$, and a cutoff frequency of the gap is $f_2$, and a cutoff frequency of the second electrode is $f_3$.

5. A high frequency piezoelectric resonator according to claim 4, wherein the convex portion is made elliptic.

6. A high frequency piezoelectric resonator according to claims 1, wherein said at least one second electrode is divided into a plurality of portions; and adjustment of frequency is performed on said at least one divided electrode so that said divided electrodes have equivalent frequency one another.

7. A high frequency piezoelectric resonator according to claim 2, wherein the configuration of the main electrode is made elliptic.

8. A high frequency piezoelectric resonator according to claim 2, wherein said at least one second electrode is divided into a plurality of portions; and adjustment of frequency is performed on said at least one divided electrode so that said divided electrodes have equivalent frequency one another.

9. A high frequency piezoelectric resonator according to claim 3, wherein
   said at least one second electrode is divided into a plurality of portions; and
   adjustment of frequency is performed on said at least one divided electrode so that said divided electrodes have equivalent frequency one another.

10. A high frequency piezoelectric resonator according to claim 7, wherein
    said at least one second electrode is divided into a plurality of portions; and
    adjustment of frequency is performed on said at least one divided electrode so that said divided electrodes have equivalent frequency one another.

11. A high frequency piezoelectric resonator according to claim 4 or 5, wherein
    said at least one second electrode is divided into a plurality of portions; and
    adjustment of frequency is performed on said at least one divided electrode so that said divided electrodes have equivalent frequency one another.

* * * * *